United States Patent [19]
Kuwahara et al.

[11] Patent Number: 6,060,744
[45] Date of Patent: May 9, 2000

[54] SEMICONDUCTOR DEVICE WITH A MAIN CURRENT CELL REGION AND A CURRENT DETECTING CELL REGION

[75] Inventors: Masashi Kuwahara, Yokohama; Shuji Kamata, Tokyo, both of Japan

[73] Assignee: Kabushiki Kaisha Toshiba, Kawasaki, Japan

[21] Appl. No.: 08/959,275

[22] Filed: Oct. 28, 1997

[30] Foreign Application Priority Data

Oct. 29, 1996 [JP] Japan ..................................... 8-286729

[51] Int. Cl.[7] ............................ H01L 29/76; H01L 29/94; H01L 31/062
[52] U.S. Cl. ........................... 257/328; 257/329; 257/242; 257/197; 257/341
[58] Field of Search ..................... 257/328, 329, 257/242, 197, 341

[56] References Cited

U.S. PATENT DOCUMENTS

| | | | |
|---|---|---|---|
| 4,809,045 | 2/1989 | Yilmaz | 357/23.4 |
| 5,821,580 | 10/1998 | Kuwahara | 257/330 |

*Primary Examiner*—Mahshid Saadat
*Assistant Examiner*—Matthew E. Warren
*Attorney, Agent, or Firm*—Oblon, Spivak, McClelland, Maier & Neustadt, P.C.

[57] ABSTRACT

In a current detecting cell of a MOS-type semiconductor device with a current detection function, the area of the contact portions of source regions which contact a current detecting electrode is greater than that of that contact portion of a base region which contacts the current detecting electrode. With this feature, a parasitic resistance does no sharply decrease even if a detected voltage increases, and therefore, current can be detected accurately.

15 Claims, 9 Drawing Sheets

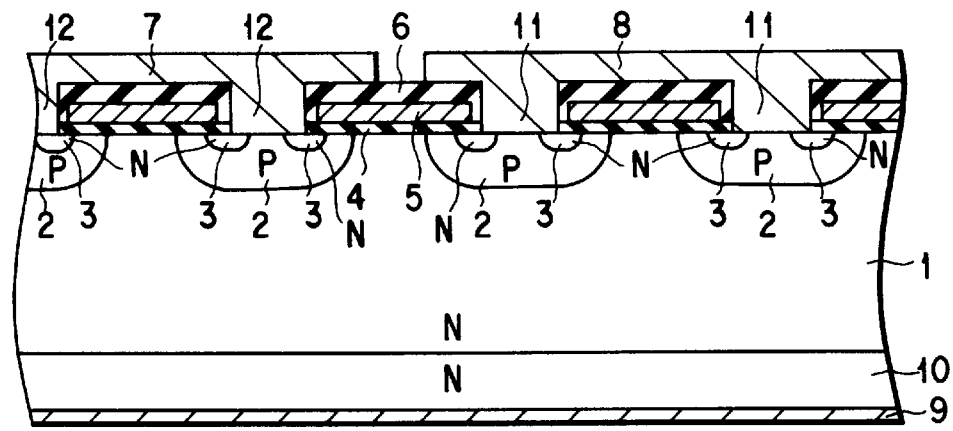
F I G. 4A
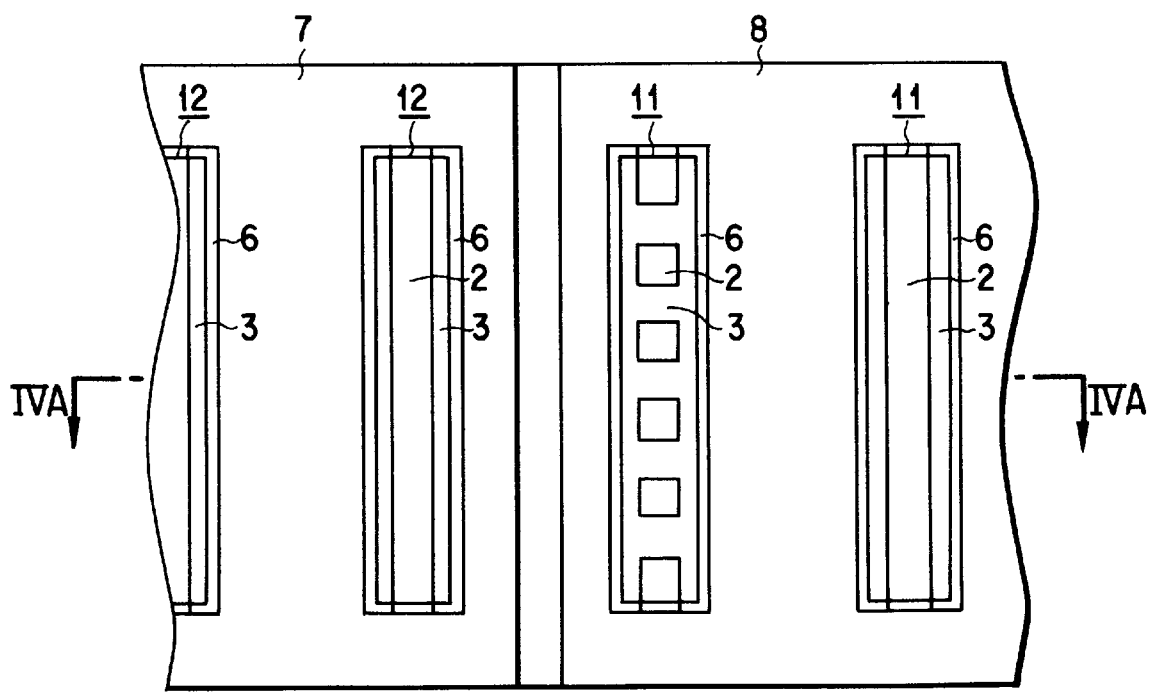
F I G. 4B

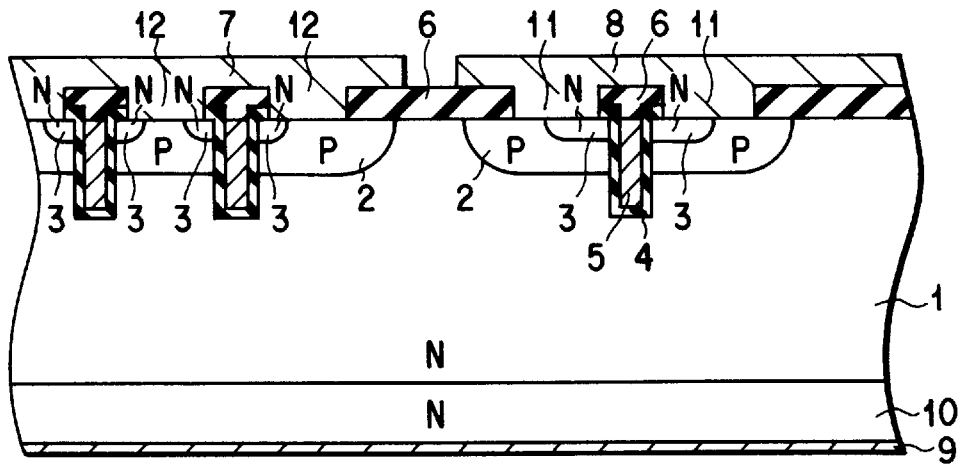
F I G. 5A
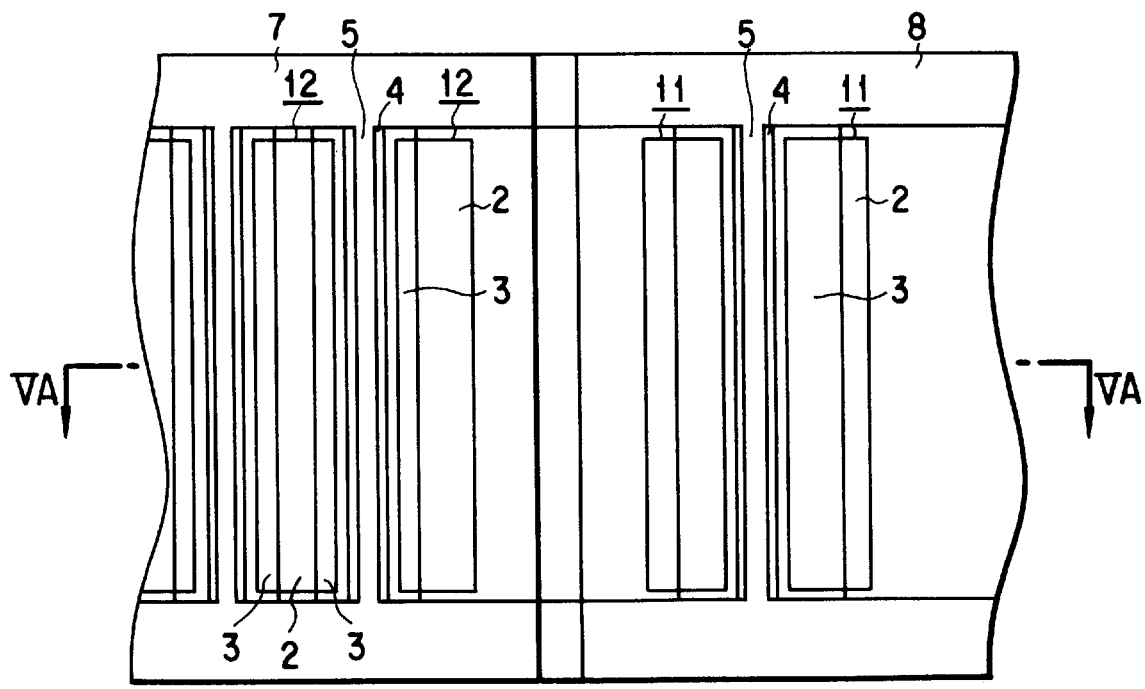
F I G. 5B

SEMICONDUCTOR DEVICE WITH A MAIN CURRENT CELL REGION AND A CURRENT DETECTING CELL REGION

BACKGROUND OF THE INVENTION

The present invention relates to a MOS—type semiconductor device with a current detection function, in particular, to an improvement in a detection voltage dependency of a current detection characteristics in an IGBT, a power MOS transistor and the like.

FIG. 10A is a cross-sectional view of a conventional semiconductor device including N-channel type planar gate MOSFETs, in particular, of a boundary portion thereof between the main current cell region and current detecting cell region. FIG. 10B is a plan view showing the pattern of the boundary portion. The cross-sectional view of FIG. 10A is taken along line XA—XA of FIG. 10B.

As shown in FIGS. 10A and 10B, the semiconductor device comprises an N-type substrate 10, an N-type drift region 1 formed on the upper surface of the substrate 10, and a drain electrode 9 formed on the back-side surface of the substrate 10. Formed in the drift region 1 are a number of P-type base regions 2 in which N-type source regions 3 are provided. Gate insulating films 4 are formed on the drift region 1, base region 2 and source region 3. Gate electrodes 5 are formed on the gate insulating films 4 and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base region 2 and the source regions 3 in the current detecting cell, are in contact with the current detecting electrode 8 via the opening 11.

In each of the openings 12 of the main current cells, the ratio of the area of the contact portion of the base region 2 to the main current electrode 7 to the total area of the contact portions of the source regions 3 to the main current electrode 7 is approximately 6:4. The same is true for the opening 11 of the current detecting cell. That is, in the opening 11 of the current detecting cell, the ratio of the area of the contact portion of the base region 2 to the current detecting electrode 8 to the total area of the contact portions of the source regions 3 to the current detecting electrode 8 is approximately 6:4.

For the current detection, an external resistor (not shown) is connected between the main current electrode 7 and the current detecting electrode 8 to detect a potential difference across the resistor. The current value is obtained from the quotient of the potential difference divided by the resistance value of the external resistor.

In general, the main current cells are provided adjacent to the current detecting cell on a semiconductor chip. A MOS gate provided between the current detecting cell and main current cells is opened in a current detection state. Thus, the current detecting cell is electrically connected to the main current cells. Inevitably, a portion of current which will otherwise flow through the external resistor flows into the main current cells through a parasitic resistor formed in the drift region 1.

In addition to the above disadvantage, the conventional device has the following further disadvantage:

The parasitic resistor is a bulk resistor of silicon and thus has a temperature dependency characteristics. The parasitic resistance increases as the temperature rises. Thus, current flowing through the external resistor increases as the semiconductor device operates, thus generating heat. Consequently, the potential difference across the external resistor (hereinafter referred to as "detection voltage") increases, and the current can no longer be accurately detected.

To reduce the disadvantage due to the temperature characteristics of the parasitic resistance, it suffices to increase the parasitic resistance so that the parasitic resistance is larger than the external resistance.

In order to increase the parasitic resistance effectively, the distance between the main current cell region and the current detecting cell region may be increased. However, if the distances between the base regions 2 of the main current cells and the base region 2 of the current detecting cell are increased, the curvature of each of depletion layers is increased. As a result, an electric field concentrates between those base regions, lowering the breakdown voltage. Therefore, in the conventional device, the distance between the main current cell region and the current detecting cell region must be long enough to electrically isolate the main current cell region from the current detecting cell region, but should not be so long as to lower the breakdown voltage.

For the above reasons, it is difficult for the conventional device to reduce the influence of the temperature characteristics of the parasitic resistance, and to prevent lowering of the breakdown voltage.

Furthermore, when the detection voltage exceeds 0.6V, a forward bias voltage is applied to the PN junction between the P-type base region 2 of the current detecting cell and N-type drift region 1. Holes flow from the base region 2 into the drift region 1. The resistance of the drift region 1 rapidly decreases. So does the parasitic resistance between the detecting electrode 8 and the main current electrode 7.

FIG. 8 also shows the relationship between the detection voltage and the parasitic resistance in the conventional semiconductor device and a semiconductor device of the present invention. As is clearly understood from FIG. 8, the parasitic resistance rapidly decreases when the voltage exceeds 0.5V in the conventional device.

The current which is to be flown through the external resistor inevitably flows through the parasitic resistance. The ratio of current flowing through the detecting cell (hereinafter referred to as "detection current") to current flowing through the main current cells (hereinafter referred to as "main current") therefore decreases. FIG. 9 also represents the relationship between the detected voltage and the ratio of the main current to the detection current in the conventional semiconductor device and a semiconductor device of the present invention. As is seen from FIG. 9, the ratio rapidly increases when the detection voltage exceeds 0.5V in the conventional semiconductor device.

Thus, the detection current varies due to variation of the detection voltage. Therefore, it is difficult to design a current detecting circuit. Furthermore, the main current greatly varies in the current detection operation, and thus the device may malfunction.

In general, semiconductor devices for use in current detection are of bipolar type. In a bipolar-type semiconductor device, the detection voltage is set to 0.5 to 0.6V in order to detect a current. However, if an MOS-type semiconductor device is used to detect a current, the detection voltage needs to be set to about 1V, due to the difficulty in control of the threshold voltage of the MOS transistors. As shown in FIG. 8, the parasitic resistance is considerably low when the detection voltage is about 1V. Thus, the parasitic resistance can hardly be set at a value greater than the external resistance.

BRIEF SUMMARY OF THE INVENTION

In view of the foregoing, the object of the present invention is to provide an MOS-type semiconductor device in which the detection voltage dependence of the current detection characteristic of the current detecting element is improved, and in which the current can accurately be detected even if the detection voltage is high.

In order to attain the object, the semiconductor device of the present invention comprises: a semiconductor substrate; a drift region of a first conductivity type formed on an upper surface of the semiconductor substrate, including a main current cell region and a current detecting cell region; main current cells of MOS structures which comprise base regions of a second conductivity type formed in the main current cell region of the drift region, source regions of the first conductivity type formed in the base regions in the main current cell region, and gate electrodes formed on the source regions, the base regions and the drift region in the main current cell region, with insulating films interposed between the gate electrodes and the source, base and drift regions in the main current cell region; at least one current detecting cell of a MOS structure, formed on the current detecting cell region, which comprises a base region of the second conductivity type formed in the current detecting cell region of the drift region, source regions of the first conductivity type formed on the base region in the current detecting cell region, and a gate electrode formed on the source regions, the base region and the drift region in the current detecting cell region, with an insulating film interposed between the source, base and drift regions in the current detecting cell region; a main current electrode contacting the source regions and the base regions of the main current cells; a current detecting electrode contacting the source regions and the base region of the current detecting cell; and a drain electrode contacting a back-side surface of the semiconductor substrate, wherein a ratio of a total area of those contact portions of the source regions of the at least one current detecting cell which contact the current detecting electrode to an area of that contact portion of the base region which contacts the current detecting electrode is greater than a ratio of a total area of those contact portions of the source regions of each of the main current cells which contact the main current electrode to an area of that contact portion of the base region of the each main current cell which contacts the main current electrode.

It is preferable that in the at least one current detecting cell, the total area of the contact portions of the source regions of the at least one current detecting cell which contacts the current detecting electrode is greater than the area of that contact portion of the base region of the at least one current detecting cell, and the total area of the contact portions of the source regions of the each main current cell which contacts the main current electrode is smaller than the area of that contact portion of the base region of the each main current cell.

The MOS structure of each main current cell and the MOS structure of the at least one current detecting cell may be of trench type. The semiconductor substrate may be of a second conductivity type which is opposite to the first conductivity type. A buffer region of the first conductivity type may be provided between the drift region and the semiconductor substrate of the second conductivity type. The MOS structure of each main current cell and the MOS structure of the at least one current detecting cell may be of planar type. The semiconductor substrate may be of the first conductivity type.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a cross-sectional view of a semiconductor device of the present invention according to a fourth embodiment.

FIG. 4B is a plan view showing patterns of the semiconductor device of the fourth embodiment.

FIG. 5A is a cross-sectional view of a semiconductor device of the present invention which has trench gate type MOSFETs.

FIG. 5B is a plan view of the semiconductor device shown in FIG. 5A.

DETAILED DESCRIPTION OF THE INVENTION

The embodiments of the present invention will be explained with the accompanying drawings.

Figure 1A:
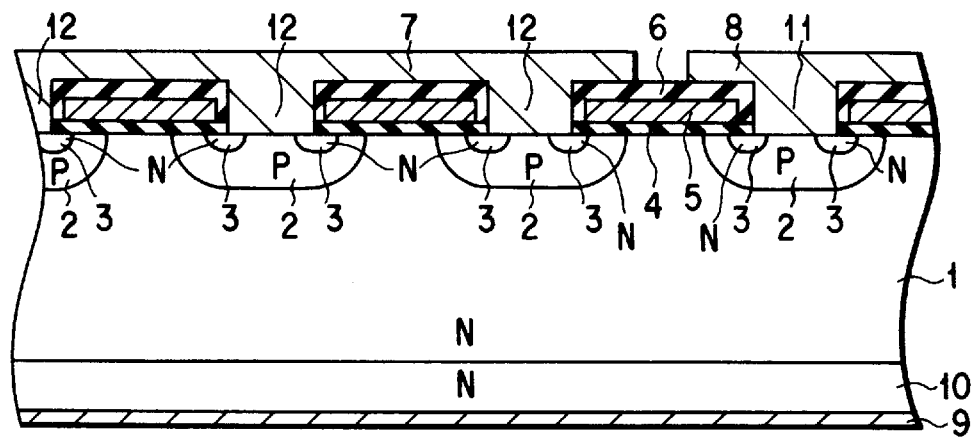
FIG. 1A is a cross-sectional view of a semiconductor device of the present invention according to a first embodiment.
Figure 1B:
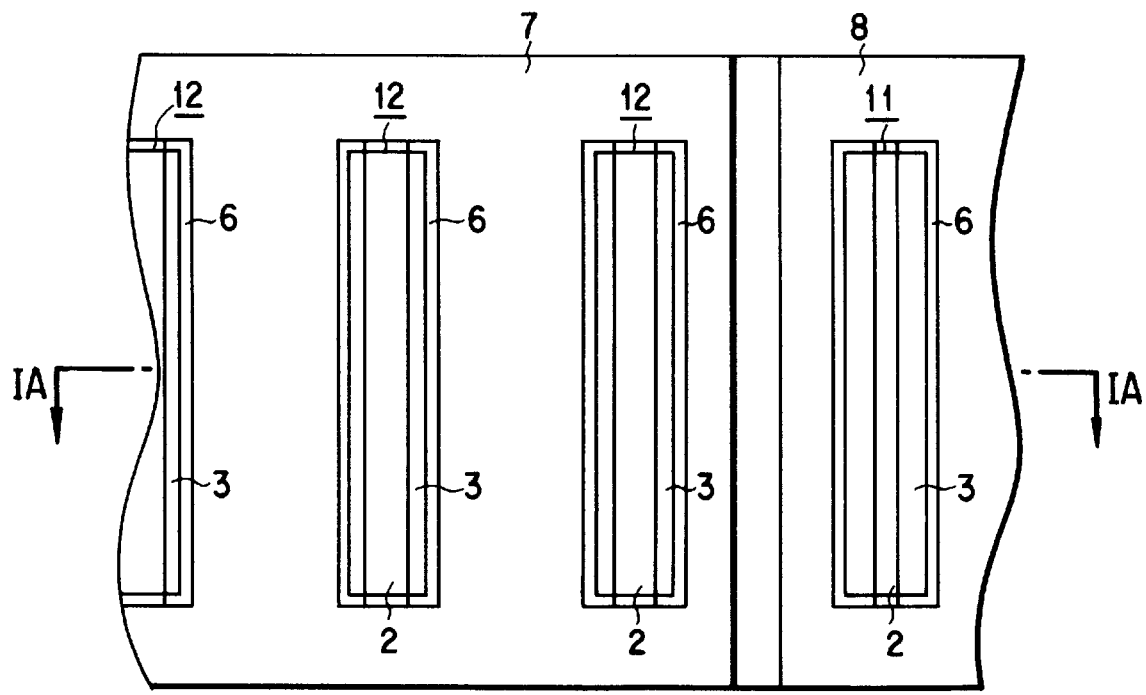
FIG. 1B is a plan view showing patterns of the semiconductor device of the first embodiment.

FIGS. 1A and 1B show a first embodiment of the present invention. FIG. 1B is a plan view showing a pattern of a boundary portion between a main current cell region and a current detecting cell region. FIG. 1A is a cross-sectional view taken along line IA—IA in FIG. 1B. In the other figures, the same structural elements as in FIGS. 1A and 1B are respectively denoted by the same reference numerals. Those structural elements are explained with reference to FIGS. 1A and 1B as set out below, and thus thereafter, the explanations thereof are omitted.

In the first embodiment of the present invention, a drain electrode 9 is provided on the back-side surface of an N-type semiconductor substrate 10, and an N-type drift region 1 is formed on the upper surface of the semiconductor substrate 10. The drift region 1 has an impurity concentration and a thickness which are determined in accordance with the breakdown voltage of a semiconductor device to be formed. P-type base regions 2 having a predetermined depth are formed in a surface portion of the drift region 1. N-type source regions 3 having a predetermined depth are formed in the base regions 2. Gate insulating films 4 are provided on the drift regions 1, the base regions 2 and the source regions 3. Gate electrodes 5 are provided on the gate insulating films 4, and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base region 2 and the source regions 3 in the current detecting cell are in contact with the current detecting electrode 8 via the opening 11.

In the first embodiment, as may be understood from the above, the current detecting cell includes only one unit cell. As shown in FIG. 1B, in the current detecting cell, the opening 11 of the current detecting cell has an elongated rectangular shape as viewed from above. The contact portions of the source regions 3 to the current detecting electrode 8 extend along the longitudinal sides of the opening 11. The contact portion of the base region 2 to the current detecting electrode 8 extends between the contact portions of the source regions 3. Such a pattern is referred to as a stripe pattern. In the first embodiment, the contact portion of the base region 2 of the current detecting cell has a width smaller than that of a conventional semiconductor device. Thus, in the current detecting cell, the total area of the contact portions of the source regions 3 is greater than the area of the contact portion of the base region 2. By virtue of this feature, in the current detecting cell, the total area of the contact portions of the source regions 3 is set to be sufficiently great. On the other hand, in each of the main current cells, the area of the contact portion of the base region 2 to the main current electrode 7 is greater than the total area of the contact portions of the source regions 3 to the main current electrode.

For the current detection, an external resistor (not shown) having, e.g., several-ten ohm to several-hundred ohm is connected between the main current source electrode 7 and the current detecting electrode 8, and the potential difference across the external resistor is detected. A current value is detected from the quotient of the potential difference divided by the external resistance (the value of the external resistor). For example, when a current flowing in the main current cells is 10 A, a current flowing in the current detecting cell is 10 mA.

Figure 8:
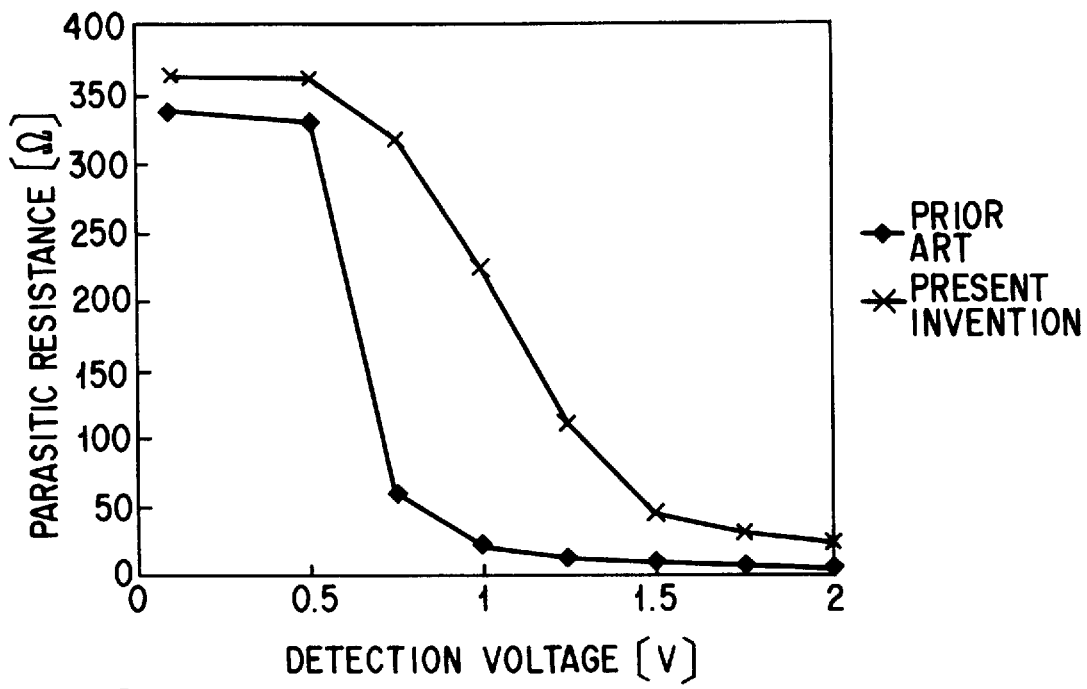
FIG. 8 is a graph for showing relationships between the detected voltages and parasitic resistances of the semiconductor device of the present invention and a conventional semiconductor device.

In the first embodiment, in the current detecting cell, the area of the contact portion of the base region 2, as mentioned above, is small, restricting the flow of minor carriers from the base region 2 to the drift region 1. As a result, the turn-on characteristics of the PN junction between the base region 2 and the drift region 1 degrades, and the turn-on voltage increases. FIG. 8 shows relationships between the detection voltages and parasitic resistances of the conventional semiconductor device and the semiconductor device of the present invention. According to FIG. 8, in the current detecting cell of the conventional semiconductor device, the ratio of the area of the contact portion of the base region 2 to the current detecting electrode 8 to the total area of the contact portions of the source regions 3 thereto is 6:4. In the current detecting cell of semiconductor device of the present invention, the ratio of the area of the contact portion of the base region 2 to the current detecting electrode 8 to the total area of the contact portions of the source regions 3 thereto is 2:8. Thus, in the present invention, the detection voltage can be increased. In addition, the parasitic resistance more gently decreases as the detection voltage increases than in the conventional semiconductor device. This is clear from FIG. 8. For example, even if the detection voltage is 1.0V, a current can be detected without being influenced by the differences between the threshold voltages of MOS transistors.

Figure 9:
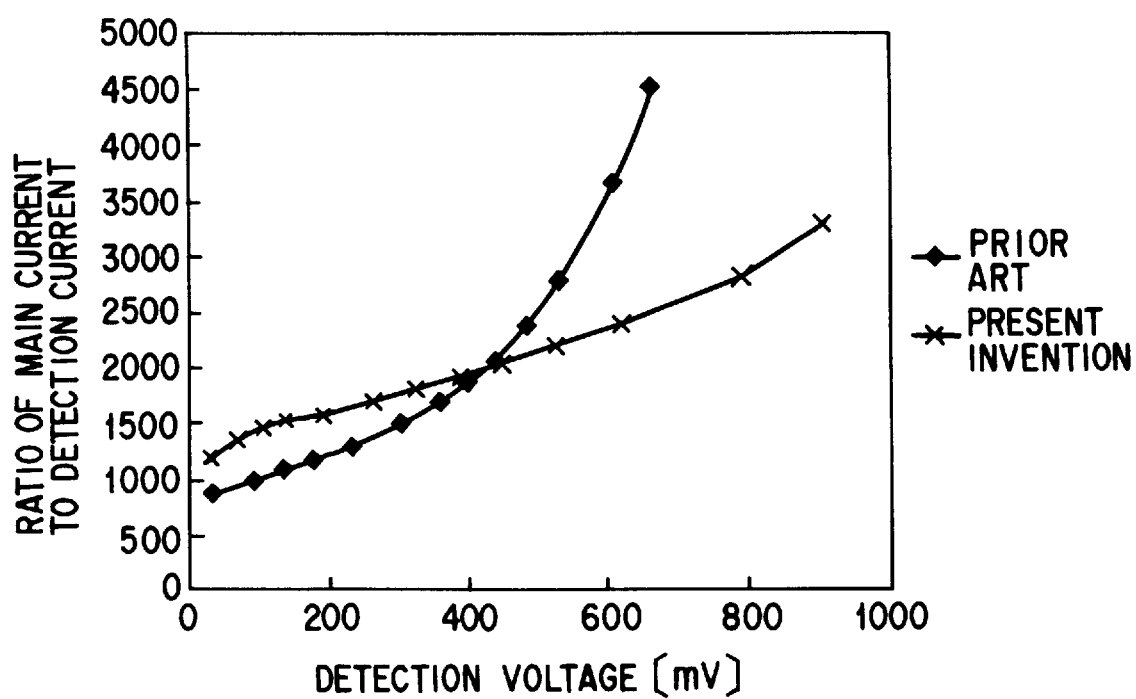
FIG. 9 is a graph for showing relationships between the detected voltages and the ratios of the main current to the detection current in the semiconductor device of the present invention and the conventional semiconductor device.
Figure 10A:
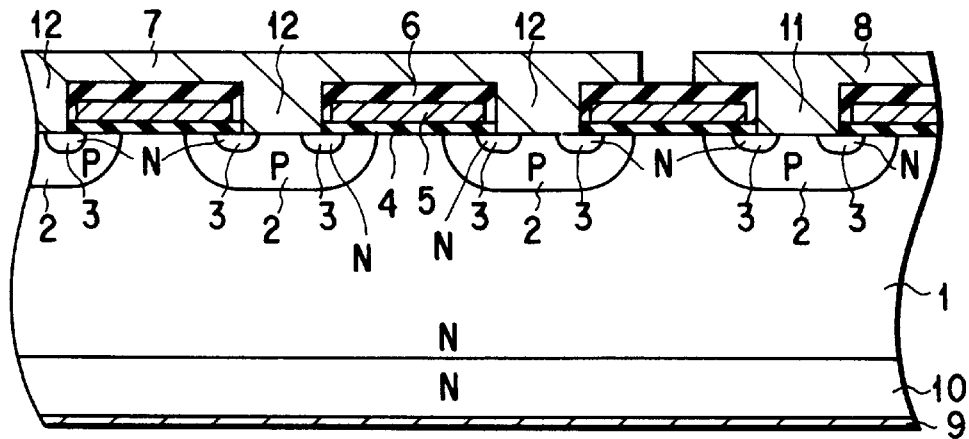
FIG. 10A is a cross-sectional view of the conventional semiconductor device.
Figure 10B:
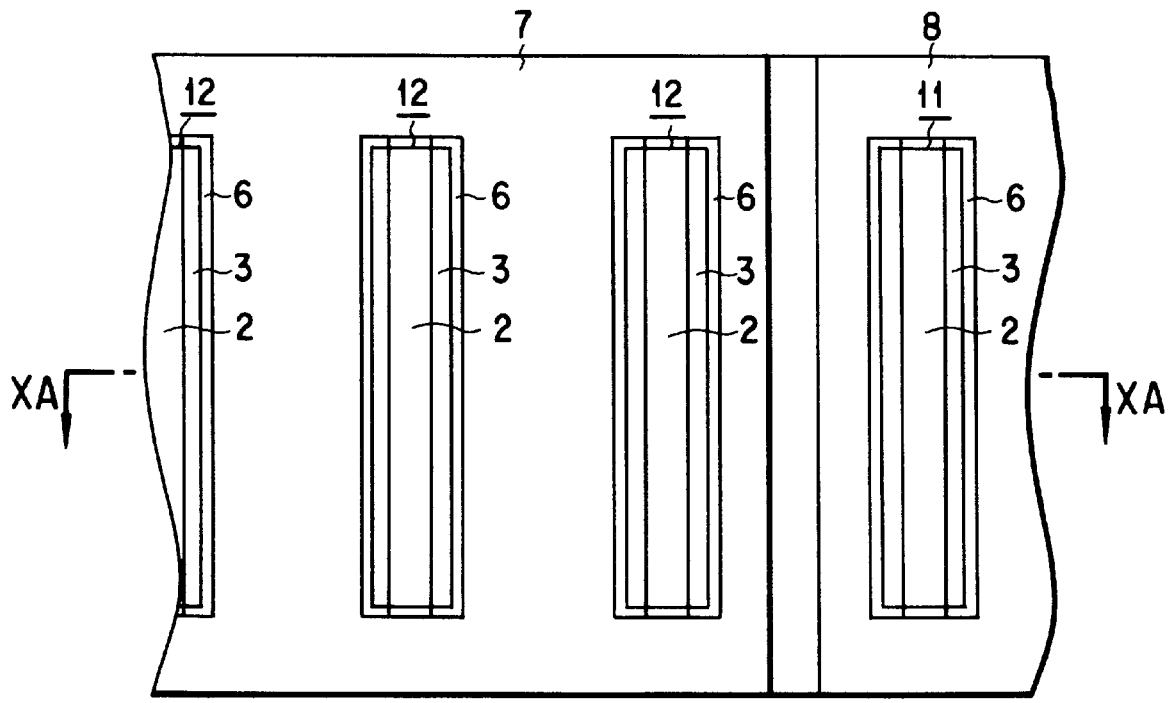
FIG. 10B is a plan view showing patterns of the conventional semiconductor device.

FIG. 9 shows the relationships between the detection voltages and the ratios of the main current to the detection current in the conventional semiconductor device and the semiconductor device of the present invention. The same conventional semiconductor device and the same semiconductor device of the present invention were used to obtain the characteristics shown in FIG. 9 as those used to obtain the characteristics of FIG. 8. As stated above, in the first embodiment, the amount of carriers flowing from the base region 2 to the drift region 1 is decreased. Thus, as shown in FIG. 9, the ratio of the main current to the detection current less varies than in the conventional device, improving the accuracy with the current is detected.

As is clear from the above, the first embodiment of the present invention can be provided simply by replacing the mask patterns used in the conventional device with the patterns explained above. The manufacturing steps are the same as or similar to those for the conventional device. Thus, the manufacturing cost is not increased.

Figure 2A:
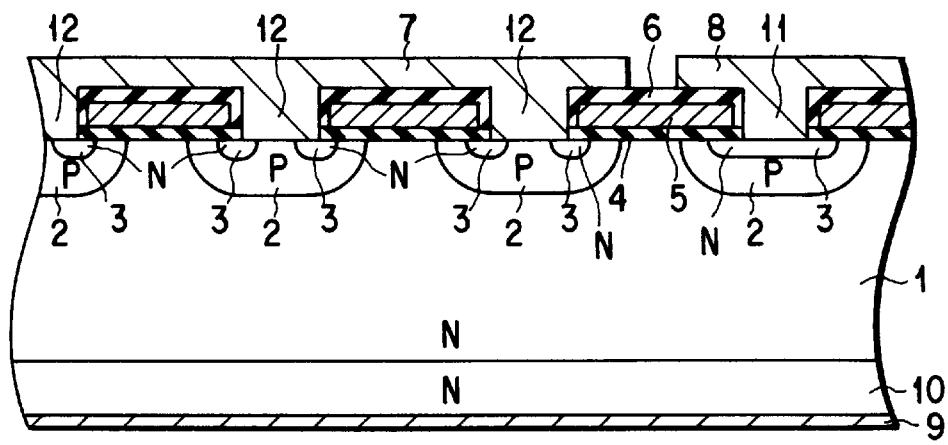
FIG. 2A is a cross-sectional view of a semiconductor device of the present invention according to a second embodiment.
Figure 2B:
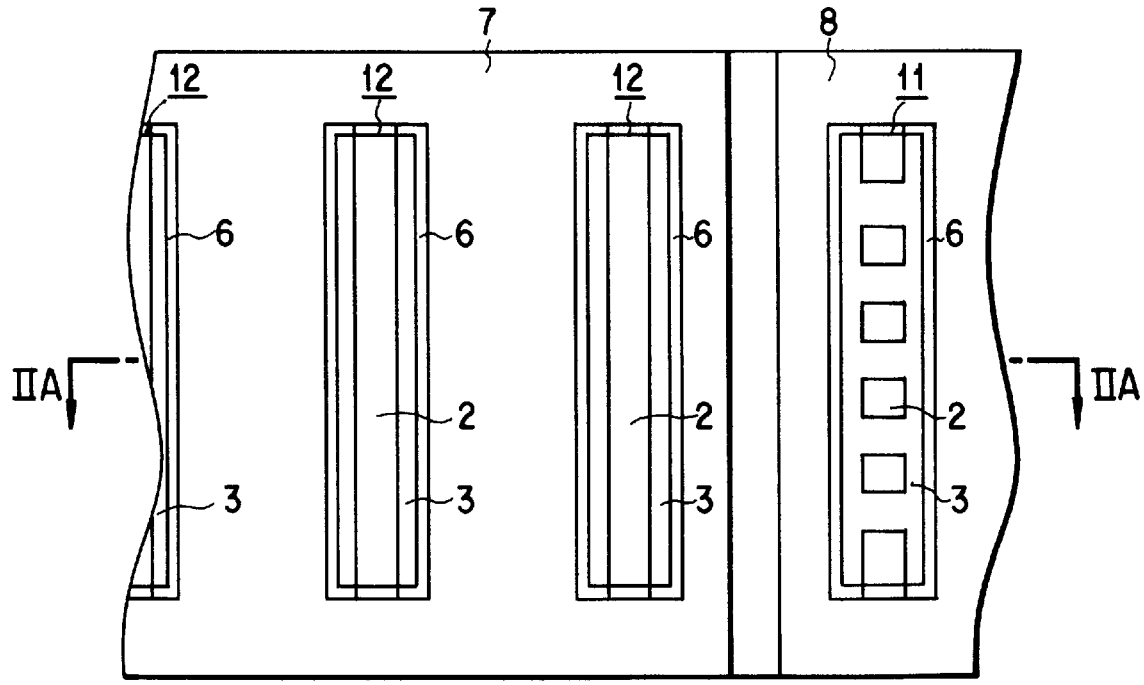
FIG. 2B is a plan view showing patterns of the semiconductor device of the second embodiment.

FIGS. 2A and 2B show a second embodiment of the present invention. Also in the second embodiment of the present invention, a drain electrode 9 is provided on the back-side surface of an N-type semiconductor substrate 10, and an N-type drift region 1 is formed on the upper surface of the semiconductor substrate 10. The drift region 1 has an impurity concentration and a thickness which are determined in accordance with the breakdown voltage of a semiconductor device to be formed. P-type base regions 2 having a predetermined depth are formed in a surface portion of the drift region 1. N-type source regions 3 having a predetermined depth are formed in the base regions 2. Gate insulating films 4 are provided on the drift regions 1, the base regions 2 and the source regions 3. Gate electrodes 5 are provided on the gate insulating films 4, and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base region 2 and the source region 3 in the current detecting cell are in contact with the current detecting electrode 8 via the opening 11.

In the current detecting cell of the second embodiment, the pattern of the source region 3 differs from that of the source region 3 of the first embodiment. To be more specific, unlike the pattern of the source region 3 shown in FIGS. 1A and 1B, the pattern of the source region 3 of the second embodiment does not have a stripe shape; it has a ladder-shape and extends along the longitudinal direction of the opening 11. FIG. 2B is a plan view showing a pattern of the boundary portion between the main current cell region and the current detecting cell region. FIG. 2A is a cross-sectional view taken along line IIA—IIA in FIG. 2B.

In the second embodiment also, in the current detecting cell, the total area of the contact portions of the source regions 3 is greater than the area of the contact portion of the base region 2. Furthermore, in each main current cell, the source regions 3 have a stripe shape, and the area of the contact portion of the base region 2 is greater than the total area of the contact portions of the source regions 3.

In the current detecting cell of the second embodiment, the source region 3, as mentioned above, is ladder-shaped, and thus the area of the source region 3 is sufficiently great without the need to increase the length of the source region 3. Thus, the same or similar advantages to those in the first embodiment can be obtained. Furthermore, a parasitic NPN transistor can be prevented from operating, and thus the breakdown voltage can be prevented from being lowered. In each main current cell, the source regions 3 have stripe shapes, and the area of the contact portion of the base region 2 is greater than the total area of the contact portions of the source regions 3.

Figure 3A:
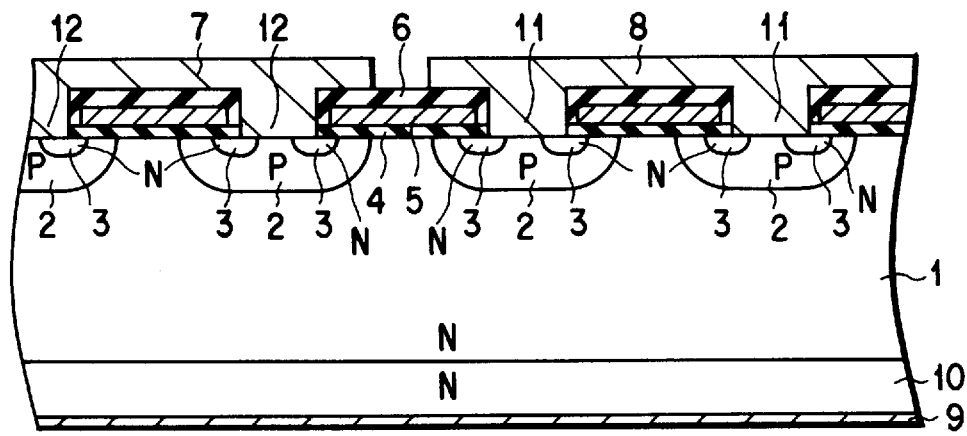
FIG. 3A is a cross-sectional view of a semiconductor device of the present invention according to a third embodiment.
Figure 3B:
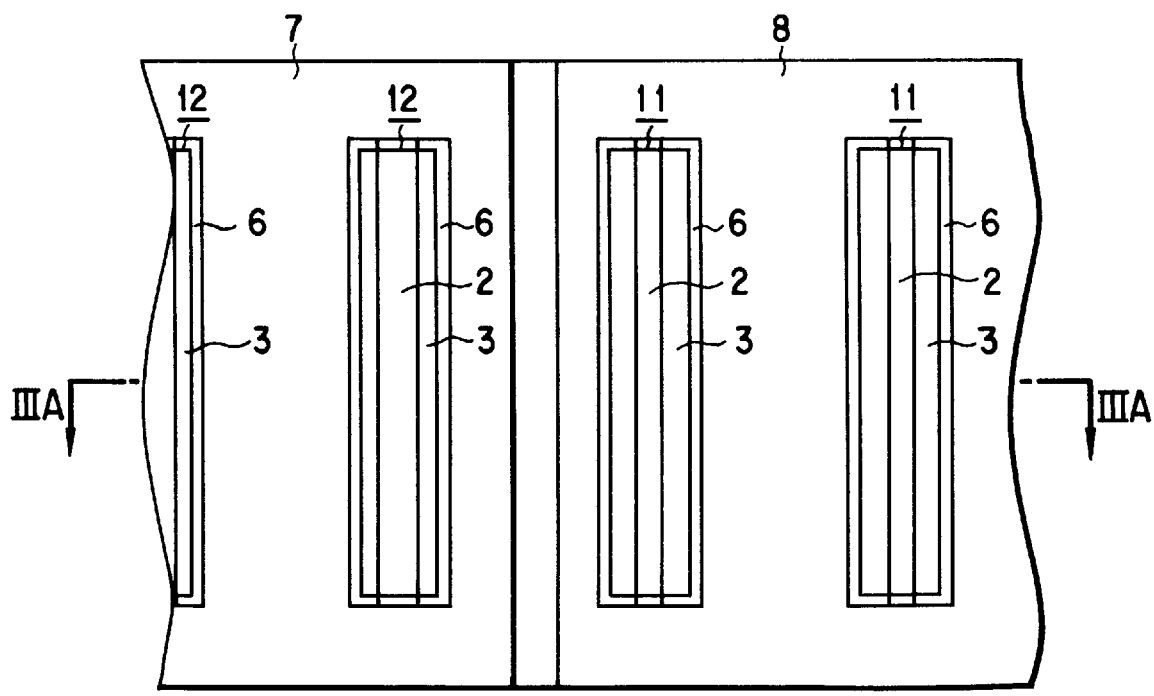
FIG. 3B is a plan view showing patterns of the semiconductor device of the third embodiment.

FIGS. 3A and 3B show a third embodiment of the present invention. In the third embodiment, a plurality of current detecting cells are provided. FIG. 3B is a plan view showing a pattern of the boundary portion between the main current cell region and the current detecting cell region. FIG. 3A is a cross-sectional view taken along line IIIA—IIIA of FIG. 3B.

Also in the third embodiment of the present invention, a drain electrode 9 is provided on the backside surface of an N-type semiconductor substrate 10, and an N-type drift region 1 is formed on the upper surface of the semiconductor substrate 10. The drift region 1 has an impurity concentration and a thickness which are determined in accordance with the breakdown voltage of a semiconductor device to be formed. P-type base regions 2 having a predetermined depth are formed in a surface portion of the drift region 1. N-type source regions 3 having a predetermined depth are formed in the base regions 2. Gate insulating films 4 are provided on the drift regions 1, the base regions 2 and the source regions 3. Gate electrodes 5 are provided on the gate insulating films 4, and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base regions 2 and the source regions 3 in the current detecting cell are in contact with the current detecting electrode 8 via the opening 11.

More specifically, in the third embodiment, at least two current detecting cells are provided. Only in this regard, the third embodiment differs from the first embodiment. In each of the current detecting cells of the third embodiment, the source regions 3 have stripe shapes such that the total area of the contact portions of the source regions 3 is greater than the area of the contact portion of the base region 2 as in the first embodiment. In each main current cell, the source regions 3 have stripe shapes, and the area of the contact portion of the base region 2 is greater than the total area of the contact portions of the source regions 3.

FIGS. 4A and 4B show a fourth embodiment of the present invention. FIG. 4B is a plan view showing a pattern of the boundary portion between the main current cell region and the current detecting cell region. FIG. 4A is a cross-sectional view taken along line IV—IV in FIG. 4A.

Also in the fourth embodiment of the present invention, a drain electrode 9 is provided on the backside surface of an N-type semiconductor substrate 10, and an N-type drift region 1 is formed on the upper surface of the semiconductor substrate 10. The drift region 1 has an impurity concentration and a thickness which are determined in accordance with the breakdown voltage of a semiconductor device to be formed. P-type base regions 2 having a predetermined depth are formed in a surface portion of the drift region 1. N-type source regions 3 having a predetermined depth are formed in the base regions 2. Gate insulating films 4 are provided on the drift regions 1, the base regions 2 and the source regions 3. Gate electrodes 5 are provided on the gate insulating films 4, and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base regions 2 and the source regions 3 in the current detecting cells are in contact with the current detecting electrode 8 via the opening 11.

In the fourth embodiment, a plurality of current detecting cells are provided. In this regard, the fourth embodiment differs from the first embodiment. Two current detecting cells are shown in FIGS. 4A and 4B. Furthermore, in one of the current detecting cells which is most adjacent to the main current cells, the area of the contact portion of the source region 3 is greater than that of the contact portion of the base region 2. The total area of the contact portions of the source regions of the far-away current detecting cell is smaller than that of the contact portion of the base region 2. Furthermore, in the most-adjacent current detecting cell, the source region 3 is formed in the shape of a ladder. On the other hand, in the far-away current detecting cell, the source region 3 is formed in the shape of a stripe.

In general, the resistances of the drift regions between the main current cell region and the current detecting cells become larger as the current detecting cells are farther away from the main current cell region. That is, the resistances of the drift regions 1 between the main current cell region and the far-away current detecting cells are larger than the resistance of the drift region 1 between the main cell current region and the most-adjacent current detecting cell. Thus, even if the resistances of the drift regions of the far-away current detecting cells vary due to an increase of the temperature, the resistances less influence the detection current. Thus, as in the fourth embodiment, simply by applying the feature of the present invention to the most-adjacent current detecting cell, the same or similar advantages to those as in the first to third embodiments can be obtained.

Furthermore, if the area of the contact portion of the base region 2 to the current detecting electrode 8 of the current detecting cell is too small, an NPN parasitic transistor easily operates, and thus the breakdown voltage is lowered. However, in the fourth embodiment, the ratio of the area of the contact portion of the base region 2 to the total contact area of the current detecting electrode 8 in the far-away current detecting cell is greater than that of the area of the contact portion of the base region 2 to the total contact area of the current detecting electrode 8 in the above-mentioned most-adjacent current detecting cell. Thus, the breakdown voltage is prevented from being lowered. Furthermore, in each main current cell, the source regions 3 have stripe shapes, and the area of the contact portion of the base region 2 is greater than the total area of the contact portions of the source regions 3.

In the first to fourth embodiments, the shape of the source region 2 is not limited to the stripe shape or ladder shape.

Furthermore, in the above explanations, each of the first to fourth embodiments is directed to a semiconductor device including planar gate type MOSFETs. However, the semiconductor device of each embodiment is not limited to such a type of semiconductor device.

For example, as shown in FIGS. 5A and 5B, the present invention may be applied to a semiconductor device including MOSFETs of a trench gate structure. FIG. 5A is a cross-sectional view taken along line VA—VA in FIG. 5B. FIG. 5B is a plan view showing a pattern of the boundary portion between the main current cell region and the current detecting cell region.

More specifically, in the semiconductor device shown in FIGS. 5A and 5B, a groove is formed in such a manner as to penetrate the source region 3 and the base region 2 and extend into the drift region 1. An insulating film 4 and a gate electrode 5 are provided in the groove, forming a MOSFET of a trench gate structure.

The structure of the other portions is similar to that of the first embodiment of the present invention. That is, a drain electrode 9 is provided on the backside surface of an N-type semiconductor substrate 10, and an N-type drift region 1 is formed on the upper surface of the semiconductor substrate 10. The drift region 1 has an impurity concentration and a thickness which are determined in accordance with the breakdown voltage of a semiconductor device to be formed. P-type base regions 2 having a predetermined depth are formed in a surface portion of the drift region 1. N-type source regions 3 having a predetermined depth are formed in the base regions 2.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base region 2 and the source regions 3 in the current detecting cell are in contact with the current detecting electrode 8 via the opening 11.

In the semiconductor device shown in FIGS. 5A and 5B, the same or similar advantages to those in the first to fourth embodiments can be obtained.

Furthermore, each of the first to fourth embodiments is directed to a semiconductor device having the N-type semiconductor substrate 10. However, the present invention can be applied to a semiconductor device in which a P-type semiconductor substrate 13 is used in place of the N-type semiconductor substrate 10 to form an N-type IGBT semiconductor device.

Figure 6:
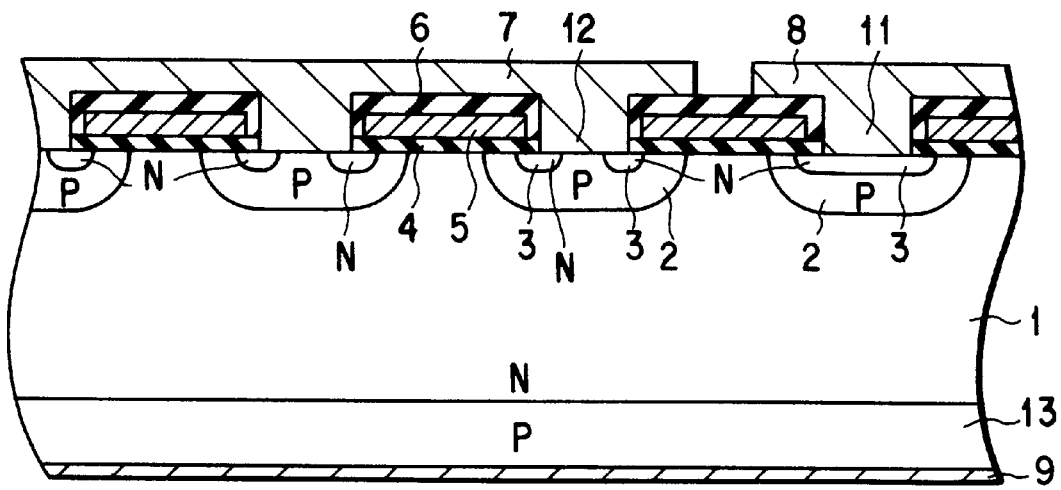
FIG. 6 is a cross-sectional view of an IGBT semiconductor device of the present invention.

FIG. 6 shows a cross-sectional view of a boundary portion of a semiconductor device which is the same as the semiconductor device shown in FIG. 2A, with the exception of the semiconductor substrate. In other words, in the semiconductor device shown in FIG. 6, a P-type semiconductor substrate 13 is used instead of the semiconductor substrate 10 shown in FIG. 2A.

Specifically, in the semiconductor device shown in FIG. 6, a drain electrode 9 is provided on the backside surface of a P-type semiconductor substrate 13, and an N-type drift region 1 is formed on the upper surface of the semiconductor substrate 13. The drift region 1 has an impurity concentration and a thickness which are determined in accordance with the breakdown voltage of a semiconductor device to be formed. P-type base regions 2 having a predetermined depth are formed in a surface portion of the drift region 1. N-type source regions 3 having a predetermined depth are formed in the base regions 2. Gate insulating films 4 are provided on the drift regions 1, the base regions 2 and the source regions 3. Gate electrodes 5 are provided on the gate insulating films 4, and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base region 2 and the source regions 3 in the current detecting cell are in contact with the current detecting electrode 8 via the opening 11.

Also in the semiconductor device shown in FIG. 6, the same or similar advantages to those in the first to fourth embodiments can be obtained.

Furthermore, the present invention may be applied to a semiconductor device in which an $N^+$-type buffer layer 14 is added to the semiconductor device shown in FIG. 6. The $N^+$-type buffer layer 14 is provided between the P-type semiconductor device 13 and the N-type drift region 1, as shown in FIG. 7.

Figure 7:
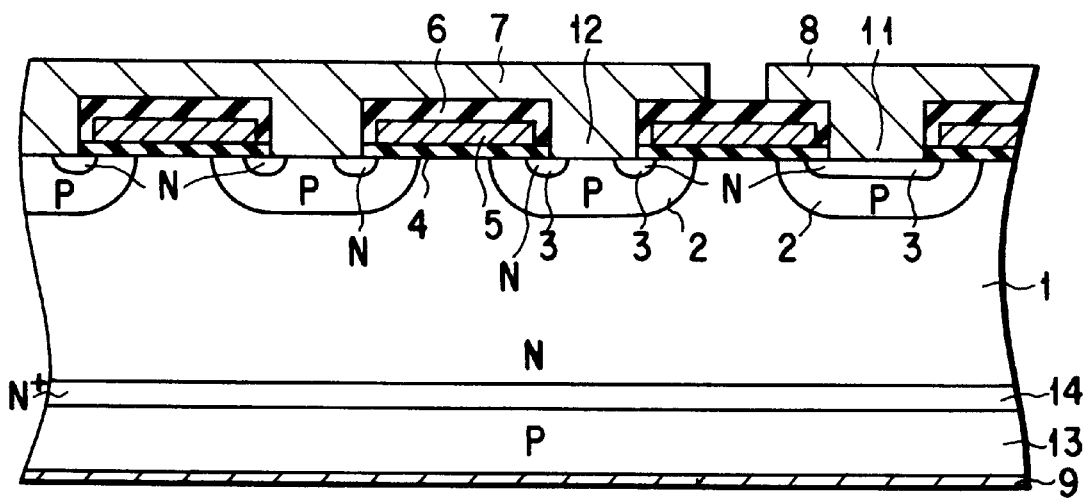
FIG. 7 is a cross-sectional view of another IGBT semiconductor device of the present invention.

Specifically, in the semiconductor device shown in FIG. 7, a drain electrode 9 is provided on the backside surface of a P-type semiconductor substrate 13, and $N^+$-type buffer layer 14 is formed on the upper surface of the semiconductor substrate 13. An N-type drift region 1 is formed on $N^+$-type buffer layer 14. The drift region 1 has an impurity concentration and a thickness which are determined in accordance with the breakdown voltage of a semiconductor device to be formed. P-type base regions 2 having a predetermined depth are formed in a surface portion of the drift region 1. N-type source regions 3 having a predetermined depth are formed in the base regions 2. Gate insulating films 4 are provided on the drift regions 1, the base regions 2 and the source regions 3. Gate electrodes 5 are provided on the gate insulating films 4, and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base region 2 and the source region 3 in the current detecting cell are in contact with the current detecting electrode 8 via the opening 11.

This semiconductor device can also obtain the same or similar advantages to those in the first to fourth embodiments.

Moreover, each of all the above-mentioned semiconductor devices is of N channel type. However, each semiconductor device may be of P channel type.

Figure 11A:
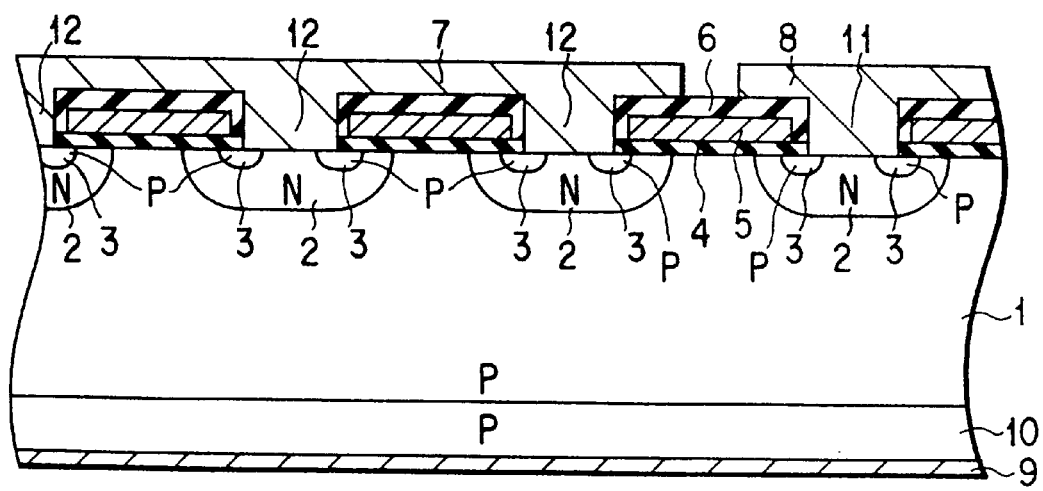
FIG. 11A is a cross-sectional view of a semiconductor device of the present invention according to a further embodiment.
Figure 11B:
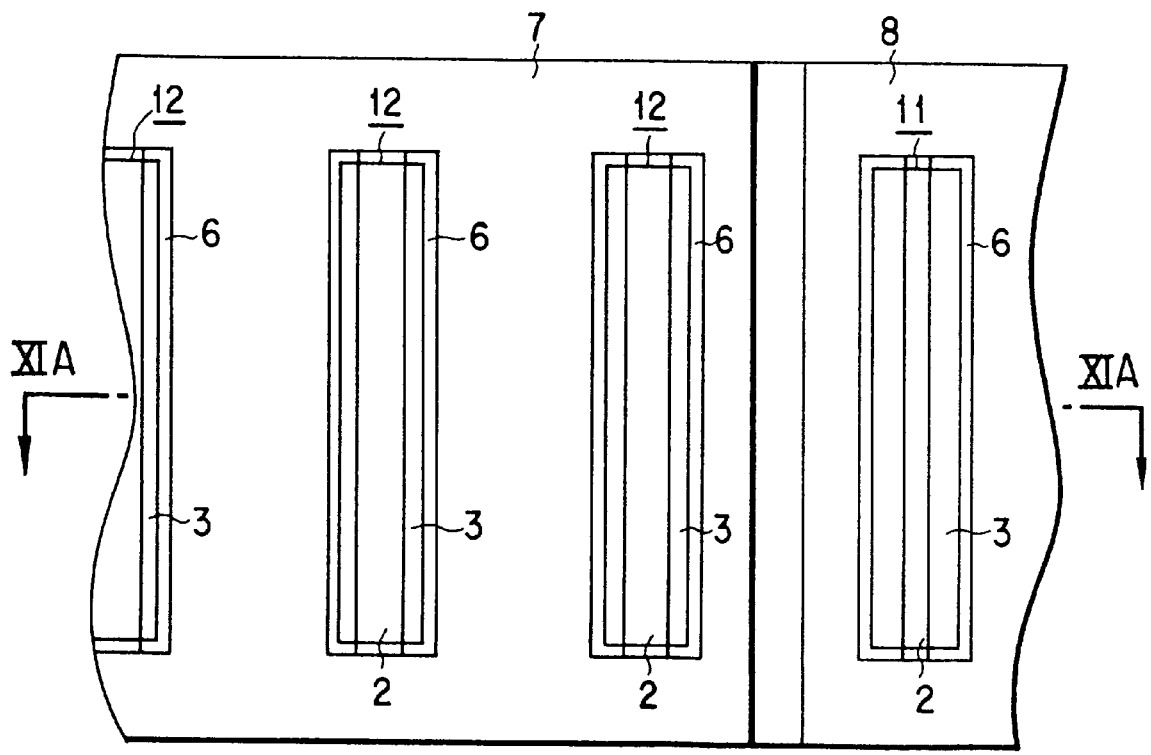
FIG. 11B is a plan view showing patterns of the semiconductor device of the further embodiment of FIG. 11A.

As an example, FIGS. 11A and 11B show a P channel type semiconductor device which corresponds in structure to the N channel type semiconductor device shown in FIG. 1.

FIG. 11B is a plan view showing a pattern of a boundary portion between a main current cell region and a current detecting cell region. FIG. 11A is a cross-sectional view taken along line XIA—XIA in FIG. 11B.

In the semiconductor device shown in FIGS. 11A and 11B, a drain electrode 9 is provided on the back-side surface of a P-type semiconductor substrate 10, and a P-type drift region 1 is formed on the upper surface of the semiconductor substrate 10. The drift region 1 has an impurity concentration and a thickness which are determined in accordance with the breakdown voltage of a semiconductor device to be formed. N-type base regions 2 having a predetermined depth are formed in a surface portion of the drift region 1. P-type source regions 3 having a predetermined depth are formed in the base regions 2. Gate insulating films 4 are provided on the drift regions 1, the base regions 2 and the source regions 3. Gate electrodes 5 are provided on the gate insulating films 4, and covered by interlayered insulating films 6.

A main current electrode 7 is provided on the surface of the main current cell region, extending into openings 12 between the gate structures of the main current cell region. A current detecting electrode 8 is provided on the surface of the current detecting cell region, extending into an opening 11 between the gate structures of the current detecting cell region. The base regions 2 and the source regions 3 of the main current cells are in contact with the main current electrode 7 via the openings 12. The base region 2 and the source regions 3 in the current detecting cell are in contact with the current detecting electrode 8 via the opening 11.

In the semiconductor device shown in FIG. 11A and 11B, the same or similar advantages to those in the first to fourth embodiments can be obtained.

As explained above, in the present invention, the area of the contact portion of the base region which contacts the current detecting electrode is smaller than the total area of the contact portions of the source regions which contact the current detecting electrode, thereby to restrict the flow of minor carriers from the base region into the drift region. Thus, the variation of the parasitic resistance can be decreased, and the accuracy with which current is detected can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. An MOS-type semiconductor device comprising: a semiconductor substrate;

a drift region of a first conductivity type formed on an upper surface of the semiconductor substrate, including a main current cell region and a current detecting cell region;

main current cells of MOS structures which comprise base regions of a second conductivity type formed in the main current cell region of the drift region, source regions of the first conductivity type formed in the base regions in the main current cell region, and gate electrodes formed on the source regions, the base regions and the drift region in the main current cell region, with insulating films interposed between the gate electrodes and the source, base and drift regions in the main current cell region;

at least one current detecting cell of an MOS structure, formed on the current detecting cell region, which comprises a base region of the second conductivity type formed in the current detecting cell region of the drift region, source regions of the first conductivity type formed on the base region in the current detecting cell region, and a gate electrode formed on the source regions, the base region and the drift region in the current detecting cell region, with an insulating film interposed between the source, base and drift regions in the current detecting cell region;

a main current electrode contacting the source regions and the base regions of the main current cells;

a current detecting electrode contacting the source regions and the base region of the current detecting cell, the current detecting electrode being separate from the main current electrode; and a drain electrode contacting a back surface of the semiconductor substrate, wherein a ratio of a total area of those contact portions of the source regions of said at least one current detecting cell which contact the current detecting electrode to an area of that contact portion of the base region which contacts the current detecting electrode is greater than a ratio of a total area of those contact portions of the source regions of each of the main current cells which contact the main current electrode to an area of that contact portion of the base region of said each main current cell which contacts the main current electrodes, to decrease reduction of a parasitic resistance between the main current cell region and the current detecting cell region.

2. The MOS-type semiconductor device according to claim 1, wherein the total area of the contact portions of the source regions of said at least one current detecting cell which contacts the current detecting electrode is greater than the area of that contact portion of the base region of said at least one current detecting cell, and the total area of the contact portions of the source regions of said each main current cell which contacts the main current electrode is smaller than the area of that contact portion of the base region of said each main current cell.

3. The MOS-type semiconductor device according to claim 1, wherein the MOS structure of said each main current cell and the MOS structure of said at least one current detecting cell are of trench type.

4. The MOS-type semiconductor device according to claim 1, wherein the semiconductor substrate is of a second conductivity type which is opposite to the first conductivity type.

5. The MOS-type semiconductor device according to claim 4, wherein a buffer region of the first conductivity type is provided between the drift region and the semiconductor substrate of the second conductivity type.

6. The MOS-type semiconductor device according to claim 1, wherein the MOS structure of said each main current cell and the MOS structure of said at least one current detecting cell are of planar type.

7. The MOS-type semiconductor device according to claim 1, wherein the semiconductor substrate is of the first conductivity type.

8. The MOS-type semiconductor device according to claim 1, wherein said first conductivity type is N conductivity type, and said second conductivity type P conductivity type.

9. The MOS-type semiconductor device according to claim 1, wherein said first conductivity type is P conductivity type, and said second conductivity type N conductivity type.

10. An MOS-type semiconductor device comprising:
    a main current cell having source and base regions;
    a main cell electrode connected to said source and base regions of said main current cell;
    a current detecting cell having source and base regions;
    a detecting cell electrode connected to said source and base regions of said current detecting cell, the detecting cell electrode being separate from the main cell electrode;
    a parasitic resistor formed between said main current cell and said current detecting cell; and
    means for decreasing the reduction of a value of resistance of said parasitic resistor as a function of detection voltage of said current detecting cell.

11. An MOS-type semiconductor device comprising:
    a main current cell having source and base regions;
    a main cell electrode connected to said source and base regions of said main current cell;
    a current detecting cell having source and base regions;
    a detecting cell electrode connected to said source and base regions of said current detecting cell, the detecting cell electrode being separate from the main cell electrode;
    wherein a first ratio of an area of a portion of said source region of said current detecting cell contacting said detecting cell electrode to an area of a portion of said base region of said current detecting cell is greater than a second ratio of an area of a portion of said source region of said main current cell contacting said main cell electrode to an area of a portion of said base region of said main current cell.

12. The MOS-type semiconductor device according to claim 11, wherein said ratios are selected to decrease the reduction of a value of resistance of said parasitic resistor as a function of detection voltage of said current detecting cell.

13. The MOS-type semiconductor device according to claim 11, comprising:
    said base regions of said current detecting cell are formed as island portions in said source regions of said current detecting cell to give said source regions of said current detecting cell a ladder configuration.

14. The MOS-type semiconductor device according to claim 11, comprising:
    a plurality of current detecting cells, each of which has said first ratio to be greater than said second ratio.

15. The MOS-type semiconductor device according to claim 11, comprising:
    a plurality of current detecting cells; wherein
    only a first one of said current detecting cells disposed closest to said main current cell has said first ratio to be greater than said second ratio; and
    remaining ones of said current detecting cells have said first ratio to be smaller than said second ratio.

* * * * *